(12) United States Patent
Yersin et al.

(10) Patent No.: US 8,716,510 B2
(45) Date of Patent: May 6, 2014

(54) BLUE LIGHT EMITTER WITH SINGLET HARVESTING EFFECT FOR USE IN OLEDS AND OTHER ORGANIC-ELECTRONIC DEVICES

(75) Inventors: Hartmut Yersin, Sinzing (DE); Rafal Czerwieniec, Obertraubling (DE); Tobias Fischer, Rimbach (DE)

(73) Assignee: Cynora GmbH, Eggenstein-Leopoldshafen (DE)

( * ) Notice: Subject to any disclaimer, the term of this patent is extended or adjusted under 35 U.S.C. 154(b) by 0 days.

(21) Appl. No.: 13/574,329

(22) PCT Filed: Jan. 19, 2011

(86) PCT No.: PCT/EP2011/050708
§ 371 (c)(1),
(2), (4) Date: Oct. 11, 2012

(87) PCT Pub. No.: WO2011/089163
PCT Pub. Date: Jul. 28, 2011

(65) Prior Publication Data
US 2013/0025649 A1 Jan. 31, 2013

(30) Foreign Application Priority Data
Jan. 20, 2010 (DE) .......................... 10 2010 005 463

(51) Int. Cl.
*C07F 15/00* (2006.01)
*C09K 11/06* (2006.01)
*H01L 31/042* (2006.01)

(52) U.S. Cl.
USPC ................. 556/136; 252/301.16; 136/244

(58) Field of Classification Search
USPC ................. 556/136; 252/301.16; 136/244
See application file for complete search history.

(56) References Cited

U.S. PATENT DOCUMENTS

2010/0141120 A1   6/2010   Yersin et al.

FOREIGN PATENT DOCUMENTS

WO    WO-2008003464 A1    1/2008

OTHER PUBLICATIONS

International Search Report for PCT/EP11/50708 mailed Mar. 3, 2011 (4 pages).

*Primary Examiner* — Porfirio Nazario Gonzalez
(74) *Attorney, Agent, or Firm* — Harris Beach PLLC

(57) ABSTRACT

The invention relates to the use of a platinum-dicyano-bisisocyanide complex cluster, having a small ΔE distance, in particular between 500 cm$^{-1}$ and 3000 cm$^{-1}$, between the lowest triplet state and the overlying singlet state that is populated by means of thermal repopulation from the triplet, in an organic-electronic device for emission of blue light and for absorption in the ultraviolet and blue spectral range. The invention also relates to the use of the singlet harvesting method. Furthermore, the invention relates to the use of the high degrees of absorption of such platinum-dicyano-bisisocyanide complex clusters.

34 Claims, 7 Drawing Sheets

Figure 7

| Cathode: Al | 200 nm |
|---|---|
| Interlayer: LiF | 0.8 nm |
| Electron transport layer ETL: Alq$_3$ | 40 nm |
| Emitter layer EML<br>100 % Emitter material | 20 nm |
| Hole transport layer HTL | 30 nm |
| Hole injection layer HIL | 10 nm |
| Anode ITO | 40 nm |
| Support material glass | |

BLUE LIGHT EMITTER WITH SINGLET HARVESTING EFFECT FOR USE IN OLEDS AND OTHER ORGANIC-ELECTRONIC DEVICES

CROSS-REFERENCE TO RELATED APPLICATIONS

This application is a national stage application under 35 U.S.C. §371 of PCT Application No. PCT/EP2011/050708, filed Jan. 19, 2011, which claims priority to and the benefit of German Application No. DE 10 2010 005 463.1, filed Jan. 20, 2010, which is incorporated herein by reference in its entirety.

The invention relates to platinum-dicyano-bisisocyanide complex clusters, having small singlet-triplet energy distances, thus exhibiting the so called singlet harvesting effect, that are good blue light emitter. Furthermore, the invention relates to the use of such complexes in organic-electronic devices such as OLEDs.

Introduction

Electro-luminescent compounds represent the main component of organic light emitting diodes (OLEDs), but there is presently a lack of good blue emitters for OLEDs. Electro-luminescent compounds are generally applied either by vacuum sublimation or by wet-chemical methods. In wet-chemical methods, the compounds are generally embedded in or chemically bonded to polymeric materials, which are generally of such nature that suitable charge carriers (electrons or holes) can be transported in them, with the provision that excitons, which transfer their energy to the respective luminescent compound, are formed when oppositely charged charge carriers collide. This electroluminescent compound can then be converted into a particular electronic excited state, from which a light emission is carried out as completely as possible and with substantial avoidance of nonradiative deactivation processes.

A suitable electronic excited state which can also be formed by energy transfer from a suitable precursor exciton formed on matrix molecules is, apart from a few exceptions, either a singlet state or a triplet state. Since, owing to the spin statistics, the two states are generally occupied in the ration 1:3, only a maximum of 25% of the excitons generated on emission from the singlet state, which is known as fluorescence, result in emission again. By contrast, all excitons in the case of triplet emission, which is known as phosphorescence, can be utilized (triplet harvesting), meaning that in this case the internal quantum yield can achieve a value of 100% if the singlet state, which is excited at the same time and is energetically above the triplet state, relaxes completely into the triplet state (intersystem crossing) and nonradiative competing processes remain unimportant. Thus, triplet emitters can be very efficient electroluminophors and can be more suitable than mere singlet emitter for providing a high light yield in an organic light emitting diode.

However, the phosphorescent triplet emitters in OLEDs known to date have the disadvantage that the emission lifetime, which is in the range of a few to many microseconds, is relatively long. This gives rise to disadvantages, namely that the majority of or all emitter molecules exhibit saturation effects with increasing current densities due to the occupation. Consequently, further charge carrier currents can no longer result in occupation of the excited and emitting states. Then, only undesired ohmic losses occur. As a consequence, a significant drop in efficiency of the OLED device (so called "roll-of" behavior) arises with increasing current density. In a similarly unfavorable manner, triplet-triplet annihilation and self-quenching have an effect (see Ref. [1]). A significant reduction in the emission lifetime of the emitter molecules could greatly weaken these processes of efficiency reduction.

Surprisingly, it is possible to utilize an effect, which results in a clear reduction of the emission lifetime, but wherein the high efficiency facilitated by triplet harvesting can nevertheless be fully achieved. This is the "singlet harvesting" process, which is proposed here for the first time. This is explained in FIG. 1. The $T_1$ state is occupied by the already known effects of triplet harvesting [2], and the usual $T_1 \rightarrow S_0$ phosphorescence results, but with an unfavorably long emission lifetime. The platinum-dicyano-bisisocyanide complex clusters described for use according to the invention have a small energy difference $\Delta E$ between the singlet $S_1$ and the triplet $T_1$. In this case, thermal re-occupation from the initially very efficiently occupied $T_1$ state into the $S_1$ state can occur at room temperature. This process is controlled by the Boltzmann distribution in accordance with equation (1). The intensity ratio is then given by $$Int(S_1 \rightarrow S_0)/Int(T_1 \rightarrow S_0) = k(S_1)/k(T_1)\exp(-\Delta E/k_B T) \quad (1)$$

$k_B$ here represents the Boltzmann constant and T represents the absolute temperature. $k(S_1)/k(T_1)$ is the rate ratio of the transfer processes from the singlet $S_1$ relative to that from the triplet $T_1$ into the electronic ground state $S_0$. For the oligomers (platinum-dicyano-bisisosyanide complex clusters) proposed for use according to the invention, the ratio is considerably higher than one.

The thermal re-occupation process described opens a fast emission channel from the short-lived $S_1$ state, and the overall lifetime is significantly reduced. This reduction is the more pronounced the smaller the energy difference $\Delta E$. This will be explained with reference to a numerical example. For an energy difference of $\Delta E = 1000$ cm$^{-1}$, an intensity ratio of about 8 arises from equation (1) for room temperature applications (T=300 K) with $k_B T = 210$ cm$^{-1}$ and a rate ratio of $10^3$. This means that, in this example, the singlet emission is 8 times more intense than triplet emission. A singlet harvesting effect is thus present.

Surprisingly, the compounds (oligomers) to be used according to the invention exhibit these comparatively small energy differences $\Delta E$. As a consequence of the singlet harvesting effect, the emission lifetimes are greatly reduced, and values of actually as low as 400 ns are achieved.

The platinum-dicyano-bisisocyanide complex clusters according to the invention exhibit a $\Delta E$ difference of between 500 cm$^{-1}$ and 3000 cm$^{-1}$, preferably between 500 cm$^{-1}$ and 2000 cm$^{-1}$.

Moreover, the platinum-dicyano-bisisocyanide complex clusters according to the invention show a light emission in the blue region, particularly in the area of wave lengths from 400 nm to 500 nm. The emission maxima are located preferably between 430 nm and 480 nm.

The OLED devices are produced by processes known in the prior art (cf. [1]).

Another important aim is efficient conversion of solar energy into electrical energy. Many of the requirements of the device structure associated therewith are similar to those of the construction of an OLED. Therefore, for OLEDs, care has to be taken that the holes, coming from the anode, and the electrons, coming from the cathode, recombine at the metal complexes and emit light. Conversely, care has to be taken in organic solar cells (OSCs) or organic photo-voltaics (OPVs), starting from the metal complexes excited by sunlight, that re-emission of light does not occur, but that holes and electrons are formed and migrate to the anode or cathode, respectively. In the process leading to a photocurrent in an organic solar cell, which is composed of a plurality of "elementary" steps, a photon of the incident light is firstly absorbed by a platinum-dicyano-bisisocyanide complex cluster in the absorption layer, whereby an electronic excitation occurs. Since the cluster has other redox properties in the excited state (exciton) than in the ground state, electrical charge separation occurs within the absorption layer or at one of the layer boundaries in the case of suitably selected HOMO and LUMO levels of the hole-conductor and electron-conducter layers relative to the HOMO/LUMO levels of the absorption layer. The resulting electrons and holes migrate through the respective electron- and hole hole-conduction layers in the direction of the electrodes, causing an electric voltage to arise at the electrodes. This functional principle gives rise to the requirements for the substances used in the device:

i) Very high absorption of the dye,
ii) Relatively good hole or electron conductivities of the layers provided for this purpose,
iii) Good exciton transport in the absorption layer,
iv) Effective and fast exciton dissociation and removal of the charge carriers in the absorption layer or at one of the boundary layers in order to prevent hole-electron recombination.

The problems described in the prior art in the production of efficient OSCs arise essentially for the following two reasons:
i) The lack of materials having high light absorption, particularly in the blue and ultra-violet region, and
ii) The lack of materials having long exciton diffusion lengths, which ensures migration of the excitons out of the interior of the light-absorbing layer to, for example, the interface at which the separation of the excitons takes place.

OSC and OPV devices are produced by processes known in the prior art (cf. [3]).

DESCRIPTION OF THE INVENTION

Accordingly, one objective of the present invention was to provide substances for blue-light emissions for OLEDs or absorption dyes for the blue and ultra-violet spectral range for OSCs with which the disadvantages of the prior art can be overcome or with which, in particular, OLEDs having emitters with short emission lifetime and OSCs with high absorption can be produced.

This objective is achieved by the herein described platinum-dicyano-bisisocyanide complexes, which form clusters. As described in formulas I to VI, the isocyanide ligands comprise aliphatic or heteroaliphatic groups, which lead to a slight sterical hindrance during the formation of columnar structures. Moreover, the CH- and $CH_2$-groups, which are in vicinity of the CN-groups show an electron donating effect. Both effects lead to appropriate Pt-Pt distances within the columnae and due to the Pt-Pt interactions in the clusters blue light emissions result in OLEDs.

By providing an organic electronic device containing a platinum-dicyano-bisisocyanide complex cluster, which has a small $\Delta E$ difference between the lowest triplet state and the higher singlet state, which is occupied by thermal reoccupation from the triplet state, advantageous organic electronic devices are made possible. A small $\Delta E$ difference here means a separation of between 500 $cm^{-1}$ and 3000 $cm^{-1}$, preferably between 500 $cm^{-1}$ and 2000 $cm^{-1}$.

For a given complex, the energy difference $\Delta E$ can be determined simply using equation (1) indicated above. A rearrangement gives the following:

$$\ln \{Int(S_1 \rightarrow S_0)/Int(T_1 \rightarrow S_0)\} = \ln \{k(S_1)/k(T_1)\} - (\Delta E/k_B)(1/T) \quad (1a)$$

Any commercially available spectrophotometer can be used for the measurement. A graphic plot of the (logarithm of the) intensity ratios measured at various temperatures ln {Int $(S_1 \rightarrow S_0)/Int(T_1 \rightarrow S_0)$} against the reciprocal of the absolute temperature T generally gives a straight line. The measurement is carried out in a temperature range from room temperature to 77 K, where the temperature is set by means of a cryostat. The Intensities are determined from the (corrected) spectra, where $Int(S_1 \rightarrow S_0)$ and $Int(T_1 \rightarrow S_0)$ represent the integrated fluorescence and phosphorescence band intensities, respectively, which can be determined by means of the software of the spectrophotometer. They can easily be identified since the triplet band is located at lower energies than the singlet band and increases in intensity with decreasing temperature. The slope of the straight line is $-\Delta E/k_B$. With $k_B=1,380 \; 10^{-23} \; JK^{-1}=0,695 \; cm^{-1} \; K^{-1}$, the energy difference can be determined directly.

Organic electronic devices as defined by the invention are in particular organic light-emitting diodes (OLEDs), light-emitting electrochemical cells (LEECs or LECs), OLED-sensors, in particular gas and vapor sensors, that are not hermetically sealed, organic solar cells (OSCs; organic photovoltaics, OPVs), organic field effect transistors, organic lasers, "down conversion" systems, organic diodes or organic photodiodes.

The compounds to be used according to the invention are mononuclear, neutral platinum-dicyano-bisisocyanide complexes. Such compounds form oligomers (also referred to as "cluster" or "columnar structure arrangements"). The platinum-platinum interaction results in electronic states having the desired properties described above, i.e. these oligomers/clusters have a small energy difference $\Delta E$ and consequently facilitate singlet harvesting and exhibit strong absorptions. Interestingly, electronic interactions between the platinum centers give rise to energetic states, which lead to a blue emission. Moreover, relatively high HOMOs (highest occupied molecular orbitals [1]) and relatively low LUMOs (lowest unoccupied molecular orbitals [1]) arise. This has advantages for exciton formation directly on the emitter in the OLED application [2] and has favorable properties as absorber in OSCs.

The compounds to be applied according to the invention in organic electronic devices are described in formula I:

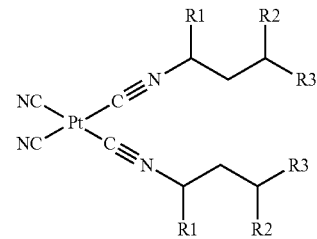

Formula I wherein
I. 1.: R1, R3=each independently H or a branched or unbranched aliphatic or heteroaliphatic group $C_nH_{2n+1}$ with $1 \leq n \leq 15$. One to four $CH_2$ subgroups can be replaced by the following (not neighboring) hetero groups or heteroatoms

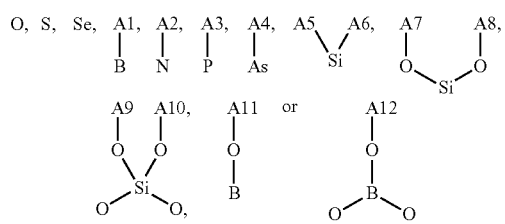

with A1, A2 . . . A12=H or an aliphatic group: $C_mH_{m+1}$ ($1 \leq m \leq 10$)
and
R2=a branched or unbranched aliphatic or heteroaliphatic group $C_nH_{2n+1}$ with $2 \leq n \leq 15$. One to four $CH_2$ subgroups can be replaced by the following (not neighboring) hetero groups or heteroatoms.

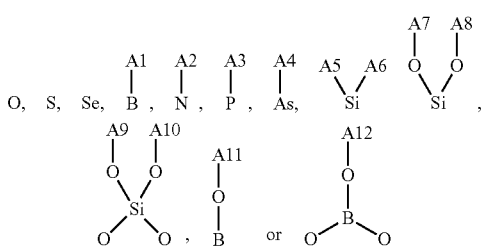

with A1, A2 ... A12=H or an aliphatic group: $C_mH_{2m+1}$ (1≤m≤10)
or

I. 2.: R1=$CH_3$
and
R2, R3=each independently H or a branched or unbranched aliphatic or heteroaliphatic group $C_nH_{2n+1}$ with 1≤n≤15. One to four $CH_2$ subgroups can be replaced by the following (not neighboring) hetero groups or heteroatoms

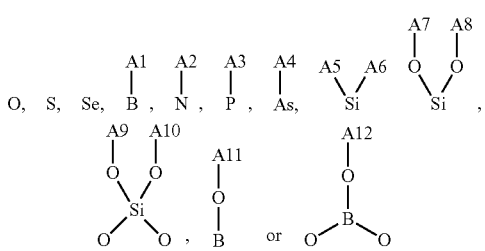

with A1, A2 ... A12=H or an aliphatic group: $C_mH_{2n+1}$ (1≤m≤10).

According to the invention, platinum-dicyano-bisisocyanide complexes of formula II are preferred:

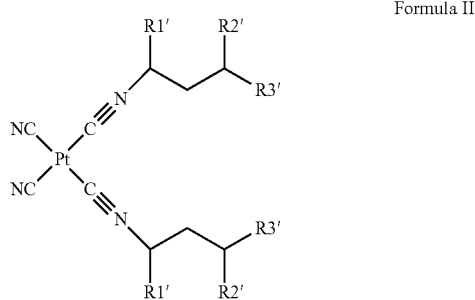

Formula II wherein rests are defined as follows:
II. 1.: R1', R3'=each independently H or a branched or unbranched aliphatic or heteroaliphatic group $C_nH_{2n+1}$ with 1≤n≤15. One to four not neighboring $CH_2$ subgroups can be replaced by an oxygen atom
and
R2'=a branched or unbranched aliphatic or heteroaliphatic group $C_nH_{2n+1}$ with 2≤n≤15. One to four not neighboring $CH_2$ subgroups can be replaced by an oxygen atom;
or
II. 2.: R1'=$CH_3$
and
R2', R3'=each independently H or a branched or unbranched aliphatic or heteroaliphatic group $C_nH_{2n+1}$ with 1≤n≤15. One to four not neighboring $CH_2$ subgroups can be replaced by an oxygen atom.

Preferably, the platinum-dicyano-bisisocyanide complex cluster described herein are used in an emitter layer of an OLED, in which the concentration of the complex in the layer is preferably 20 to 100 weight %, particularly preferably 50 to 100 weight %.

The platinum-dicyano-bisisocyanide complex cluster described herein can also be used in an absorber layer of an organic solar cell, in which the amount of the complex in the layer is preferably 20 to 100 weight %, particularly preferably 50 to 100 weight %.

An organic solar cell can comprise different solar cell units. In a preferred embodiment of the invention, the side of the OSC closest to the incoming light, comprising a platinum-isocyanide complex according to the convention, a first solar cell unit absorbs the blue or ultraviolet spectral component; in a second solar cell unit, which is located subjacent in the direction of the light irradiation, the green component, and in a third solar cell unit the red/IR component is absorbed. Therein, the first solar cell is transparent for green and red light and IR-radiance and the second solar cell is transparent for red light and IR-radiation.

The invention also pertains to the use of a platinum-dicyano-bisisocyanide complex cluster, which exhibits a ΔE difference between the lowest triplet state and the overlying singlet state of between 500 $cm^{-1}$ and 3000 $cm^{-1}$ in an organic electronic device.

Said organic electronic device is preferably selected from the group consisting of organic electroluminescent devices (OLEDs), light-emitting electrochemical cells (LEECs or LECs), OLED sensors, in particular gas and vapor sensors which are not hermetically screened from the outside, organic solar cells (OSCs), organic field-effect transistors, organic lasers, organic diodes, organic photo diodes and "down conversion" systems, i.e. systems for the transformation of ultraviolet light to blue light.

In a preferred embodiment of this use, the platinum-dicyano-diisocyanide complex cluster is both charge transfer material and light emitter in the organic electronic device.

Furthermore the invention pertains to a method for the generation of light, particularly within the range of wavelengths from 400 nm to 500 nm. The emission maxima are preferably between 430 and 480 nm, comprising the step of the provision of a cluster-forming platinum-dicyano-bisisocyanide complex, particularly according to formulas I to VI.

The invention also pertains to a method for the generation of blue emission with a short emission decay period using a cluster-forming platinum-dicyano-bisisoyanide complex, particularly according to a complex of formulas I to VI.

Moreover, the invention refers to a method for the production of an organic electronic device, which is particularly selected from the group consisting of organic electroluminescent devices (OLEDs), light-emitting electrochemical cells (LEECs or LECs), OLED sensors, in particular gas and vapour sensors which are not hermetically screened from the outside, organic solar cells (OSCs), organic field-effect transistors, organic lasers, organic diodes, organic photo diodes and "down conversion" systems, wherein a platinum-isocyanide complex, particularly according to formula I, preferably according to the formulas II to VI is used.

FIGURES

The invention is now explained in greater detail with reference to the drawing of the figures.

FIG. 1 shows the singlet harvesting effect. In the electroluminescence process, the singlet state $S_1$ is occupied via the singlet path (25%) and the triplet state $T_1$ via the triplet path (75%). After the very rapid process of intersystem crossing (ISC), the singlet excitation also relaxes very quickly into the triplet state $T_1$, i.e. all the excitation energy is collected in the triplet state $T_1$ (triplet harvesting) [1]. In the case of the platinum-dicyano-bisisocyanide complex cluster used according to the invention, which have a small energy difference between states $T_1$ and $S_1$, state $S_1$ is thermally re-occupied effectively in accordance with $k_BT$ (thermal equilibrium). As a consequence, a very short decay time for the emission result.

FIG. 7 shows schematically the way in which an embodiment of an OLED functions. The device comprises at least an anode, a cathode and an emitter layer.

Figure 1:
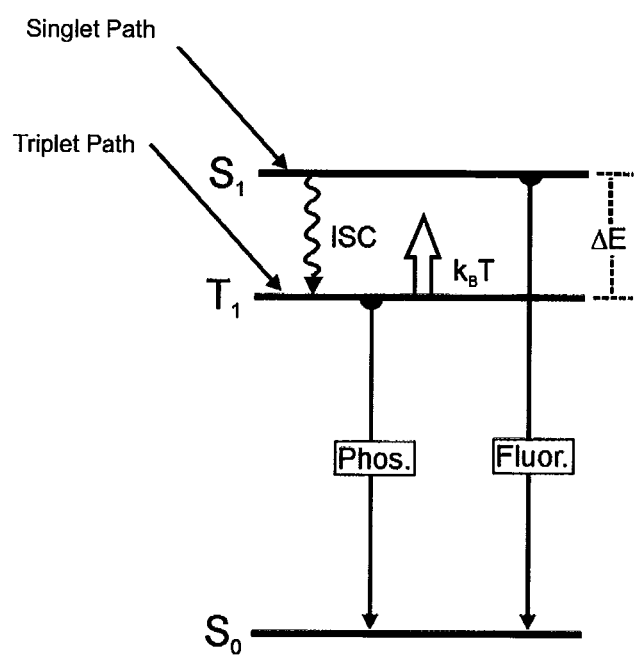

One or both of the electrodes used as cathode or anode advantageously is transparent, enabling the light to be emitted through this electrode. The transparent electrode material used is preferably indium tin oxide (ITO). Particularly preferred it the use of a transparent anode. The other electrode can likewise be of transparent material, but may also be made from another material having a suitable electron work function if light is only to be emitted through one of the two electrodes. The second electrode, in particular the cathode, preferably consists of a metal of high electrical conductivity, for example aluminium or silver, or an Mg/Ag or Ca/Ag alloy.

An emitter layer is arranged between the two electrodes. This can be in direct contact or indirect contact with the anode and the cathode, where indirect contact means that further layers are present between the cathode or anode and the emitter layer, such that the emitter layer and the anode and/or cathode do not touch one another, but instead are in electrical contact with another via further intermediate layers. Upon application of a voltage, for example a voltage of 2-20 V, in particular 5-10 V, negatively charged electrons are emitted from the cathode, for example a conductive metal layer, particularly preferably from an aluminium cathode and migrate in the direction of the positive anode. Positive charge carriers, so-called holes, in turn migrate from this anode in the direction of the cathode. According to the invention, the emitter layer arranged between the cathode and anode comprises a platinum-dicyano-bisisocyanide complex cluster, particularly of the formula I to VI as emitters. The migrating charge carriers, i.e. a negatively charged electron and a positively charged hole, recombine at the emitter oligomers or in their vicinity and result in neutral, but energetically excited states of emitter substances. The excited states of the emitter then release the energy as light emission.

CITED LITERATURE

[1] H. Yersin, Editor, "Highly Efficient OLEDs with Phosphorescent Materials", Wiley-VCH, Weinheim 2008.
[2] H. Yersin, Top. Curr. Chem. 2004, 241, 1.
[3] K. Walzer, B. Maennig, M. Pfeiffer, K. Leo, Chem. Rev. 2007, 107, 1233.
[4] CIE, Commision Internationale de Eclairage—1931, Proceedings, Cambridge University Press, Cambridge, 1932.

EXAMPLES

The invention is explained in greater detail by the following examples.

Examples for platinum-dicyano-bisisocyanide complexes, which form clusters are shown below. The resulting clusters are characterized by a small singlet-triplet distance, a short emission decay time, blue emission, and the occurrence of the singlet harvesting effect as herein described. Such complexes can be present in organic electronic devices as pure substance or as mixtures of different platinum-dicyano-bisisocyanide complexes as herein described.

Example 1

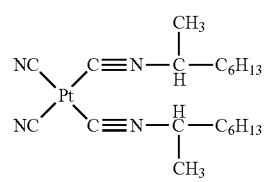

Formula III

Example 2

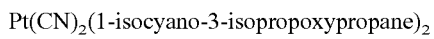

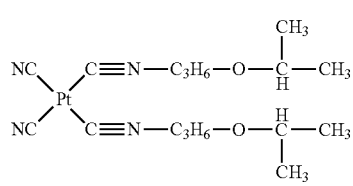

Formula IV

Example 3

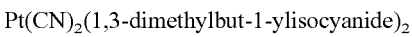

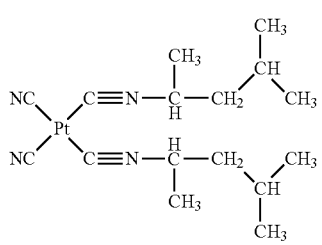

Formula V

Example 4

Pt(CN)$_2$(2-isocyanobutane)$_2$

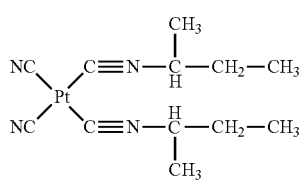

Formula VI

Example 5

Preparation and Characterization of Organic Electro-Luminescent Devices

The production of the OLEDs is carried out according to the general process outlined below. This must be adapted to the particular circumstances (for example, layer-thickness variation in order to achieve optimum efficiency or color).

General Process for the Production of OLEDs

The production of such components is based on the production of polymeric light-emitting diodes (OLEDs), which has already been described a number of times in literature (for example, in WO 04/037887 A). In the present case, the compounds according to the invention are dissolved in chloroform, dimethyl sulfoxide, dimethyl formamide, dichloromethane, acetone, acetonitrile or tetrahydrofuran together with the matrix materials or matrix material combinations indicated. The layer thickness of the emitter layer of 20 nm to 80 nm, which is typical for a device, can be achieved by means of spin coating.

Where appropriate, the platinum complexes can also be applied via vacuum sublimation or vapor phase disposition procedures.

The following compounds of the invention, the syntheses of which is described below, can be used as emitter or matrix materials.

Description of the Syntheses of the Complexes According to Formula III to VI

To a suspension of Pt(CN)$_2$ (1 mmol) in an ethanol/water mixture (40 ml, volume ratio ethanol/water 3:1) 2.2 mmol of the corresponding isocyanide is added dropwise. The suspension is stirred at room temperature for seven days. The solvent mixture is removed in vacuo. The solid remaining is washed with water and extracted three times with dichloromethane. The solvent is evaporated and the remaining crude product is crystallized from acetonitrile (if applicable, slow diffusion of diethyl ether into a solution of the complex in acetonitrile). The crystals exhibit strong blue luminescence on irradiation with ultraviolet light.

Figure 2:
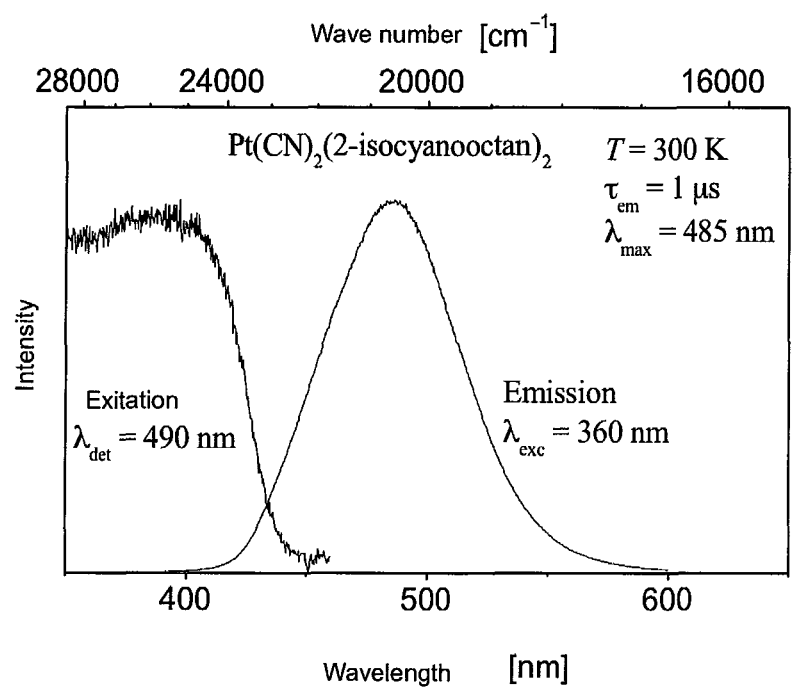
FIG. 2 shows spectra of $Pt(CN)_2(2\text{-isocyanooctane})_2$.

Analyses:

Pt(CN)$_2$(2-isocyanooctan)$_2$—spectra, see FIG. 2

Empirical formula: H$_{20}$H$_{34}$N$_4$Pt (525.6 g/mol)

Mass spectrometry: ES MS: m/z 525.3 (MH$^+$).

Figure 3:
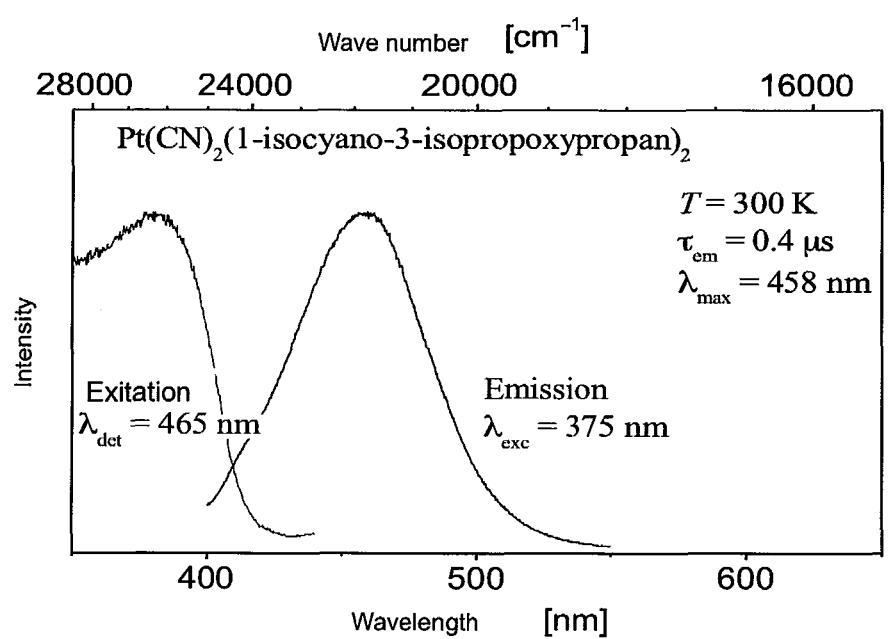
FIG. 3 shows spectra of $Pt(CN)_2(1\text{-isocyano-3-isopropoxypropane})_2$.

Pt(CN)$_2$(1-isocyano-3-isopropoxypropan)$_2$—spectra, see FIG. 3

Empirical formula: C$_{16}$H$_{26}$N$_4$O$_2$Pt (501.5 g/mol)

Mass spectrometry: ES MS: m/z 501.2 (MH$^+$).

Figure 4:
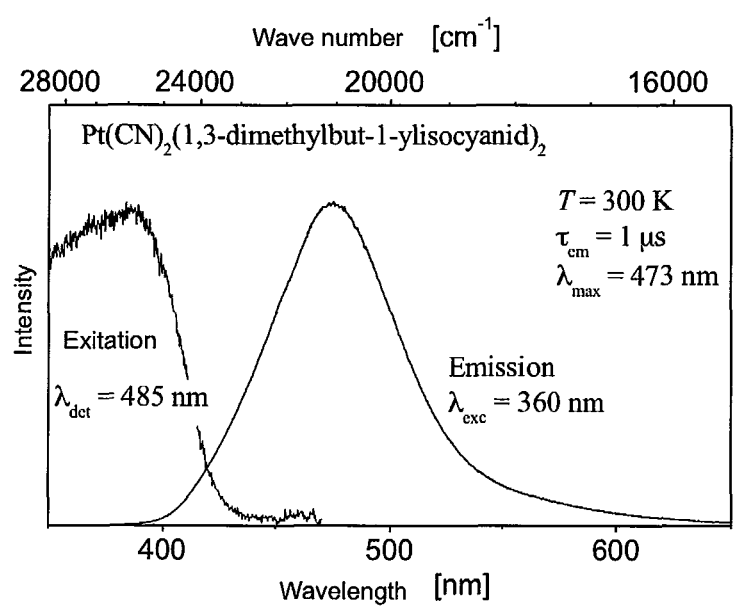
FIG. 4 shows spectra of $Pt(CN)_2(1,3\text{-dimethylbut-1-ylisocyanide})_2$.

Pt(CN)$_2$(1,3-dimethylbut-1-ylisocyanid)$_2$—spectra, see FIG. 4

Empirical formula: C$_{16}$H$_{26}$N$_4$Pt (469.5 g/mol)

Mass spectrometry: ES MS: m/z 469.2 (MH$^+$).

Figure 5:
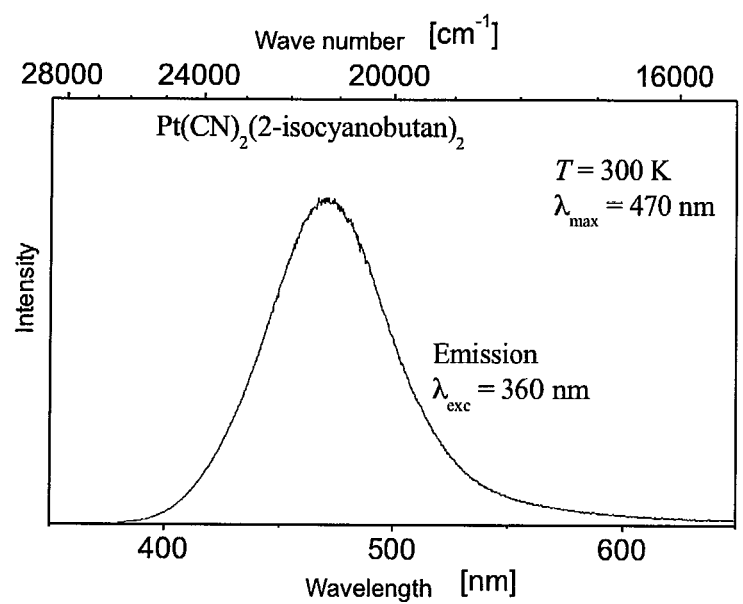
FIG. 5 shows spectra of $Pt(CN)_2(2\text{-isocyanobutane})_2$.
Figure 6:
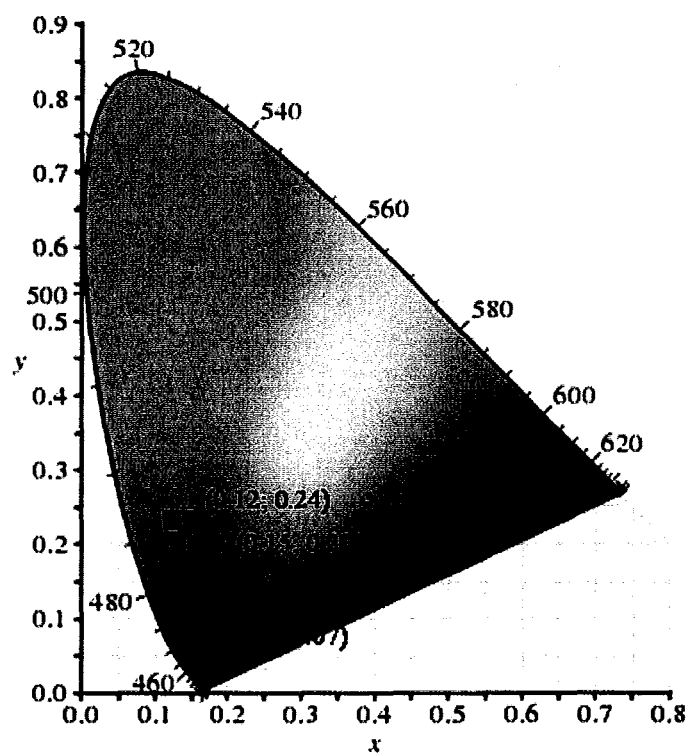
FIG. 6 shows the coordinates of the complexes of the invention corresponding to the formulas III to VI in the CIE color triangle [4], which is displayed in shades of gray.

Pt(CN)$_2$(2-isocyanobutan)$_2$—spectra, see FIG. 5

Empirical formula: C$_{12}$H$_{18}$N$_4$Pt (413.4 g/mol)

Mass spectrometry: ES MS: m/z 413.0 (MH$^+$).

The invention claimed is:

1. A method for emitting or absorbing light in the spectral range from 400 nm to 500 nm (blue light) in an organic-electronic device, comprising the step of providing a platinum-dicyano-bisisocyanide complex of formula I:

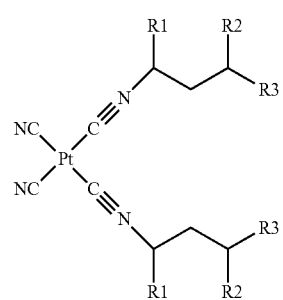

Formula I wherein (a) R1, R3=each independently H or a branched or unbranched aliphatic or heteroaliphatic group C$_n$H$_{2n+1}$X$_o$ with 1≤n+o≤15, and R2=a branched or unbranched aliphatic or heteroaliphatic group C$_n$H$_{2n+1}$X$_o$ with 2≤n+o≤15 wherein o is an integer of 0, 1, 2, 3, or 4, or (b) R1=CH$_3$ and R2, R3=each independently H or a branched or unbranched aliphatic or heteroaliphatic group C$_n$H$_{2n+1}$X$_o$ with 1≤n+o≤15, wherein o is an integer of 0, 1, 2, 3, or 4, and wherein the groups X are not neighboring and each group X individually stands for a hetero group or a heteroatom selected from the group consisting of the following hetero groups or heteroatoms:

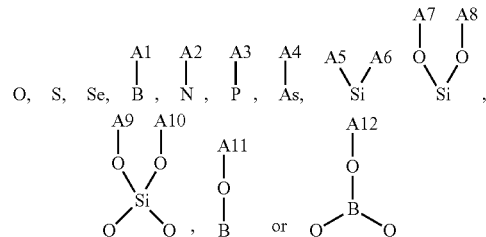

wherein A1, A2, A3, A4, A5, A6, A7, A8, A9, A10, A11 or A12=H or wherein A1, A2, A3, A4, A5, A6, A7, A8, A9, A10, A11 or A12=an aliphatic group of the formula C$_m$H$_{2m+1}$ wherein 1≤m≤10.

2. The method of claim 1, wherein the platinum-dicyano-bisisocyanide complex exhibits a structure in compliance with formula II

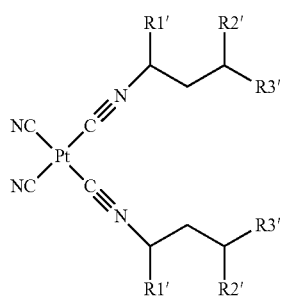

Formula II wherein the moieties are defined as follows:

(a) R1', R3'=each independently H or a branched or unbranched aliphatic or heteroaliphatic group $C_nH_{2n+1}X_o$ with $1 \leq n+o \leq 15$, and R2'=a branched or unbranched aliphatic or heteroaliphatic group $C_nH_{2n+1}X_o$ with $2 \leq n+o \leq 15$ wherein o is an integer of 0, 1, 2, 3, or 4; or (b) R1'=$CH_3$ and R2', R3'=each independently H or a branched or unbranched aliphatic or heteroaliphatic group $C_nH_{2n+1}X_o$ with $1 \leq n+o \leq 15$, wherein o is an integer of 0, 1, 2, 3, or 4, and wherein the groups X are not neighboring and stand for an oxygen atom.

3. The method of claim 1, wherein a platinum-dicyano-bisisocyanide complex cluster acts both as a charge transport material and as a light emitter.

4. An organic electronic device comprising a cluster-forming platinum-dicyano-bisisocyanide complex according to any one of

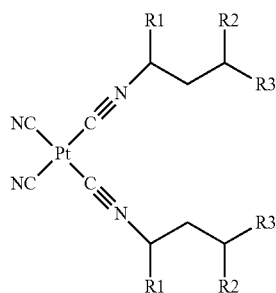

Formula I wherein (a) R1, R3=each independently H or a branched or unbranched aliphatic or heteroaliphatic group $C_nH_{2n+1}X_o$ with $1 \leq n+o \leq 15$, and R2=a branched or unbranched aliphatic or heteroaliphatic group $C_nH_{2n+1}X_o$ with $2 \leq n+o \leq 15$ wherein o is an integer of 0, 1, 2, 3, or 4, or (b) R1=$CH_3$ and R2, R3=each independently H or a branched or unbranched aliphatic or heteroaliphatic group $C_nH_{2n+1}X_o$ with $1 \leq n+o \leq 15$, wherein o is an integer of 0, 1, 2, 3, or 4, and wherein the groups X are not neighboring and each group X individually stands for a hetero group or a heteroatom selected from the group consisting of the following hetero groups or heteroatoms:

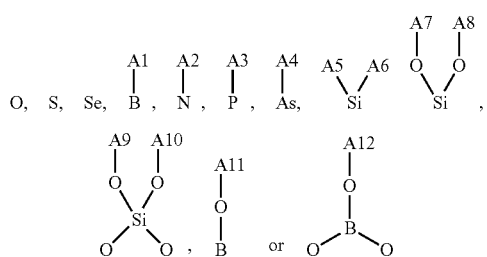

wherein A1, A2, A3, A4, A5, A6, A7, A8, A9, A10, A11 or A12=H or wherein A1, A2, A3, A4 A5 A6 A7 A8 A9 A10 A11 or A12=an aliphatic group of the formula $C_mH_{2m+1}$ wherein $1 \leq m \leq 10$;

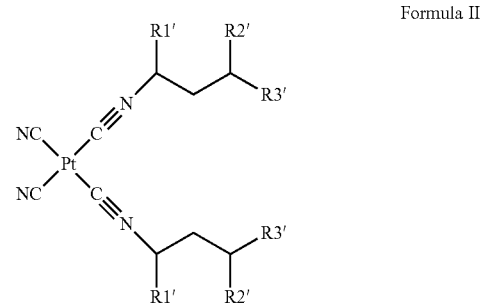

Formula II wherein the moieties are defined as follows:

(a) R1', R3'=each independently H or a branched or unbranched aliphatic or heteroaliphatic group $C_nH_{2n+1}X_o$ with $1 \leq n+o \leq 15$, and R2'=a branched or unbranched aliphatic or heteroaliphatic group $C_nH_{2n+1}X_o$ with $2 \leq n+o \leq 15$ wherein o is an integer of 0, 1, 2, 3, or 4; or (b) R1'=$CH_3$ and R2', R3'=each independently H or a branched or unbranched aliphatic or heteroaliphatic group $C_nH_{2n+1}X_o$ with $1 \leq n+o \leq 15$ wherein o is an integer of 0 1 2 3 or 4, and wherein the groups X are not neighboring and stand for an oxygen atom;

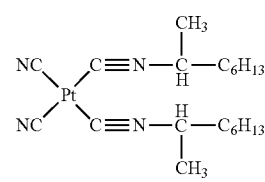

Formula III

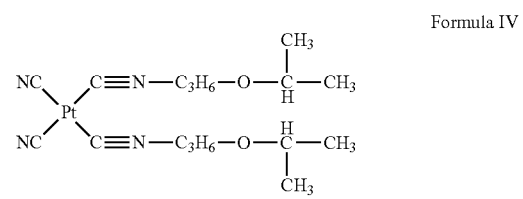

Formula IV

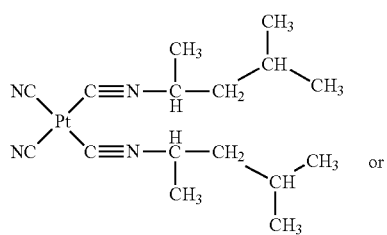

Formula V

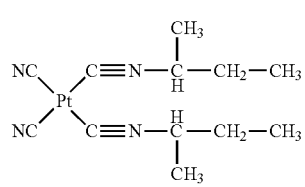

Formula VI for emission of light in the spectral range of 400 to 500 nm (blue light) and/or for absorption of light in the ultraviolet and blue spectral range.

5. The organic electronic device according to claim 4 in the form of an organic light emitting diode (OLED), wherein the organic electronic device comprises an emitter layer which exhibits a platinum-dicyano-bisisocyanide complex according to any one of formula I to VI, wherein the amount of the platinum-dicyano-bisisocyanide complex in the emitter layer is between 20 and 100 weight %.

6. The organic electronic device according to claim 4 in the form of an organic solar cell (OSC), wherein the organic electronic device comprises an absorber layer which exhibits a platinum-dicyano-bisisocyanide complex according to any one of formula I to VI, wherein the amount of the platinum-dicyano-bisisocyanide complex in the emitter layer is between 20 and 100 weight %.

7. The organic electronic device according to claim 6, wherein:

in the side of the OSC which is facing the light irradiation, a first solar cell unit absorbs only the blue and/or ultraviolet spectral component, in a second solar cell unit, wherein the second solar cell unit is located subjacent in the direction of the light irradiation, the second solar cell unit absorbs only the green component, and in a third solar cell unit, the red/IR component is absorbed, wherein the first solar cell is transparent for green and red light and for IR-radiance and the second solar cell is transparent for red light and for IR-radiance.

8. The method of claim 1, wherein blue light is emitted, comprising the step of providing a platinum-dicyano-bisisocyanide complex according to any one of formulae I to VI.

9. A method for producing an organic electronic device comprising the step of using a platinum-dicyano-bisisocyanide complex according to any one of formula I,

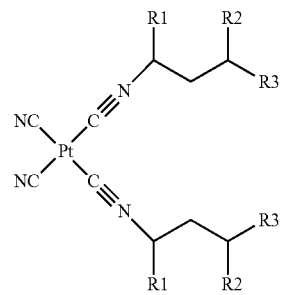

Formula I wherein
(a) R1, R3=each independently H or a branched or unbranched aliphatic or heteroaliphatic group $C_nH_{2n+1}X_o$ with $1 \leq n+o \leq 15$, and R2=a branched or unbranched aliphatic or heteroaliphatic group $C_nH_{2n+1}X_o$ with $2 \leq n+o \leq 15$ wherein o is an integer of 0, 1, 2, 3, or 4, or
(b) R1=CH$_3$ and R2, R3=each independently H or a branched or unbranched aliphatic or heteroaliphatic group $C_nH_{2n+1}X_o$ with $1 \leq n+o \leq 15$, wherein o is an integer of 0 1 2 3 or 4 and wherein the groups X are not neighboring and each group X individually stands for a hetero group or a heteroatom selected from the group consisting of the following hetero groups or heteroatoms:

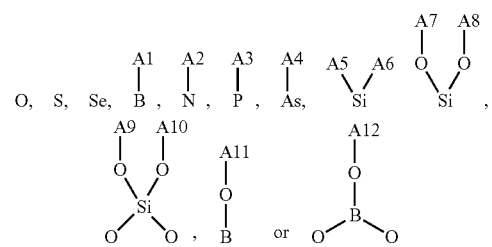

wherein A1, A2, A3, A4, A5, A6, A7, A8, A9, A10, A11 or A12=H or wherein A1, A2, A3, A4, A5, A6, A7, A8, A9, A10, A11 or A12=an aliphatic group of the formula $C_mH_{2m+1}$ wherein $1 \leq m \leq 10$;

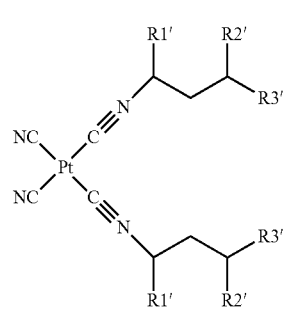

Formula II wherein the moieties are defined as follows:
(a) R1', R3'=each independently H or a branched or unbranched aliphatic or heteroaliphatic group $C_nH_{2n+1}X_o$ with $1 \leq n+o \leq 15$, and
R2'=a branched or unbranched aliphatic or heteroaliphatic group $C_nH_{2n+1}X_o$ with $2 \leq n+o \leq 15$ wherein o is an integer of 0, 1, 2, 3, or 4; or (b) R1'=CH$_3$ and R2', R3'=each independently H or a branched or unbranched aliphatic or heteroaliphatic group C$_n$H$_{2n+1}$X$_o$ with 1≤n+o≤15 wherein o is an integer of 0, 1, 2, 3, or 4 and wherein the groups X are not neighboring and stand for an oxygen atom;

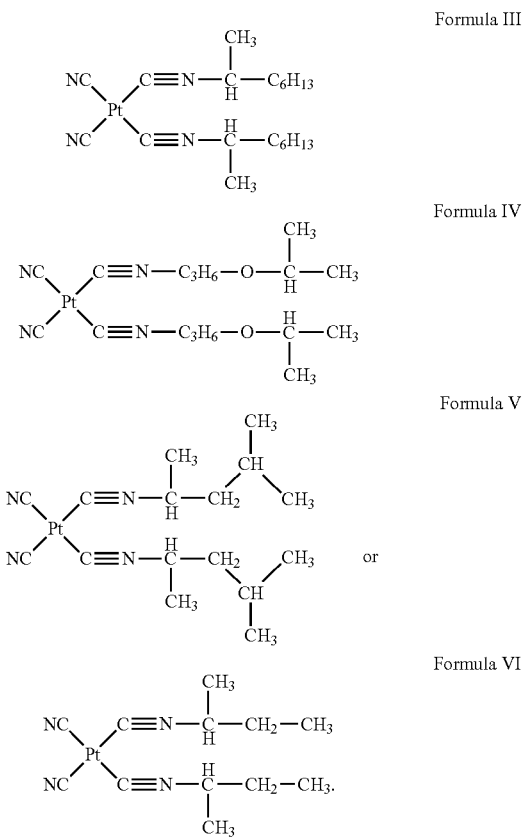

10. The method of claim 1, wherein the organic electronic device is selected from the group consisting of organic electroluminescent devices (OLEDs), light-emitting electrochemical cells (LEECs or LECs), OLED sensors, organic solar cells (OSCs), organic field-effect transistors, organic lasers, organic diodes, organic photo diodes and "down conversion" systems.

11. The method of claim 1, wherein the platinum-dicyano-bisisocyanide complex cluster has a ΔE difference between the lowest triplet state and the overlying singlet state of between 500 cm$^{-1}$ and 3000 cm$^{-1}$.

12. The method of claim 1, wherein the platinum-dicyano-bisisocyanide complex cluster exhibits an emission decay time smaller than 3 μs.

13. The organic electronic device of claim 4, wherein the organic electronic device is selected from the group consisting of organic electroluminescent devices (OLEDs), light-emitting electrochemical cells (LEECs or LECs), OLED sensors, organic solar cells (OSCs), organic field-effect transistors, organic lasers, organic diodes, organic photo diodes and "down conversion" systems.

14. The organic electronic device of claim 4, wherein the platinum-dicyano-bisisocyanide complex cluster has a ΔE difference between the lowest triplet state and the overlying singlet state of between 500 cm$^{-1}$ and 3000 cm$^{-1}$.

15. The organic electronic device of claim 4, wherein the platinum-dicyano-bisisocyanide complex cluster exhibits an emission decay time smaller than 3 μs.

16. The method of claim 9, wherein the organic electronic device is selected from the group consisting of organic electroluminescent devices (OLEDs), light-emitting electrochemical cells (LEECs or LECs), OLED sensors, organic solar cells (OSCs), organic field-effect transistors, organic lasers, organic diodes, organic photo diodes and "down conversion" systems.

17. The method of claim 9, wherein the platinum-dicyano-bisisocyanide complex cluster has a ΔE difference between the lowest triplet state and the overlying singlet state of between 500 cm$^{-1}$ and 3000 cm$^{-1}$.

18. The method of claim 9, wherein the platinum-dicyano-bisisocyanide complex cluster exhibits an emission decay time smaller than 3 μs.

19. The organic electronic device of claim 5, wherein the amount of the platinum-dicyano-bisisocyanide complex in the emitter layer is between 50 and 100 weight %.

20. The organic electronic device of claim 6, wherein the amount of the platinum-dicyano-bisisocyanide complex in the emitter layer is between 50 and 100 weight %.

21. The method of claim 8, wherein blue light is emitted in the range of wavelengths from 400 to 500 nm.

22. The method of claim 21, wherein emission maxima are between 430 and 480 nm.

23. The method of claim 10, wherein the OLED sensor is a gas or vapor sensor that is not hermetically screened from the outside.

24. The method of claim 11, wherein the ΔE difference between the lowest triplet state and the overlying singlet state is between 500 cm$^{-1}$ and 2000 cm$^{-1}$.

25. The method of claim 12, wherein the emission decay time is smaller than 1.5 μs.

26. The method of claim 12, wherein the emission decay time is smaller than 1 μs.

27. The organic electronic device of claim 13, wherein the OLED sensor is a gas or vapor sensor that is not hermetically screened from the outside.

28. The organic electronic device of claim 14, wherein the ΔE difference between the lowest triplet state and the overlying singlet state is between 500 cm$^{-1}$ and 2000 cm$^{-1}$.

29. The organic electronic device of claim 15, wherein the emission decay time is smaller than 1.5 μs.

30. The organic electronic device of claim 15, wherein the emission decay time is smaller than 1 μs.

31. The method of claim 16, wherein the OLED sensor is a gas or vapor sensor that is not hermetically screened from the outside.

32. The method of claim 17, wherein the ΔE difference between the lowest triplet state and the overlying singlet state is between 500 cm$^{-1}$ and 2000 cm$^{-1}$.

33. The method of claim 18, wherein the emission decay time is smaller than 1.5 μs.

34. The method of claim 18, wherein the emission decay time is smaller than 1 μs.

* * * * *